(12) United States Patent
Van Bommel et al.

(10) Patent No.: US 12,181,112 B2
(45) Date of Patent: Dec. 31, 2024

(54) BEAM SHAPING FOR SPIRAL LED FILAMENT SYSTEMS

(71) Applicant: SIGNIFY HOLDING B.V., Eindhoven (NL)

(72) Inventors: Ties Van Bommel, Horst (NL); Rifat Ata Mustafa Hikmet, Eindhoven (NL)

(73) Assignee: SIGNIFY HOLDING, B.V., Eindhoven (NL)

( * ) Notice: Subject to any disclaimer, the term of this patent is extended or adjusted under 35 U.S.C. 154(b) by 0 days.

(21) Appl. No.: 17/778,838

(22) PCT Filed: Nov. 12, 2020

(86) PCT No.: PCT/EP2020/081902
§ 371 (c)(1),
(2) Date: May 21, 2022

(87) PCT Pub. No.: WO2021/099205
PCT Pub. Date: May 27, 2021

(65) Prior Publication Data
US 2022/0412513 A1 Dec. 29, 2022

(30) Foreign Application Priority Data

Nov. 21, 2019 (EP) ..................................... 19210518
Feb. 11, 2020 (EP) ..................................... 20156523

(51) Int. Cl.
*F21K 9/232* (2016.01)
*F21Y 103/10* (2016.01)
(Continued)

(52) U.S. Cl.
CPC ............. *F21K 9/232* (2016.08); *H05B 45/10* (2020.01); *H05B 45/20* (2020.01); *F21Y 2103/10* (2016.08); *F21Y 2115/10* (2016.08)

(58) Field of Classification Search
CPC ....................................................... F21K 9/232
See application file for complete search history.

(56) References Cited

U.S. PATENT DOCUMENTS 10,767,816 B1 * 9/2020 Wu .......................... F21K 9/232
2005/0162850 A1 7/2005 Luk et al.
(Continued)

FOREIGN PATENT DOCUMENTS

EP 3336411 6/2018
GB 255438 A 2/1927
(Continued)

OTHER PUBLICATIONS

Machine translation of "Zhong et al.", WO 2018157428A1, published Sep. 17, 2018 (Year: 2018).*

Primary Examiner — William N Harris

(57) ABSTRACT

The present disclosure relates to a light-emitting diode, LED, filament system (770) comprising a LED filament (100) and a controller (771). The LED filament comprises a carrier (120) arranged in the shape of a spiral formed by successive loops (250). The LED filament further comprises a plurality of LEDs (110) arranged in a linear array on one side of the carrier. The LEDs are arranged along the carrier in sections (140a-f), each section having a position along the spiral-shaped carrier. The controller is configured to control a power supply to a section, or to a group of sections, of the LED filament. The controller is adapted to control a section based on its position, or a group of sections based on the positions of the sections of said group.

15 Claims, 5 Drawing Sheets

(51) Int. Cl.
*F21Y 115/10* (2016.01)
*H05B 45/10* (2020.01)
*H05B 45/20* (2020.01)

(56) References Cited

U.S. PATENT DOCUMENTS

| | | | |
|---|---|---|---|
| 2011/0019433 A1 | 1/2011 | Dussault | |
| 2011/0050073 A1* | 3/2011 | Huang | F21K 9/00 |
| | | | 313/317 |
| 2015/0204487 A1* | 7/2015 | Scapa | F21V 23/06 |
| | | | 362/221 |
| 2016/0377237 A1* | 12/2016 | Zhang | F21K 9/232 |
| | | | 362/311.02 |
| 2017/0012177 A1* | 1/2017 | Trottier | F21K 9/00 |
| 2019/0137047 A1* | 5/2019 | Hu | F21K 9/238 |
| 2019/0191535 A1 | 6/2019 | Hikmet et al. | |
| 2019/0342983 A1 | 11/2019 | Meerbeek et al. | |
| 2019/0368667 A1* | 12/2019 | On | F21K 9/238 |
| 2020/0166182 A1* | 5/2020 | Yeung | H01L 27/153 |
| 2020/0212014 A1* | 7/2020 | Chen | F21K 9/232 |

FOREIGN PATENT DOCUMENTS

| | | |
|---|---|---|
| JP | 2004253328 A | 9/2004 |
| JP | 2014179318 A | 9/2014 |

* cited by examiner

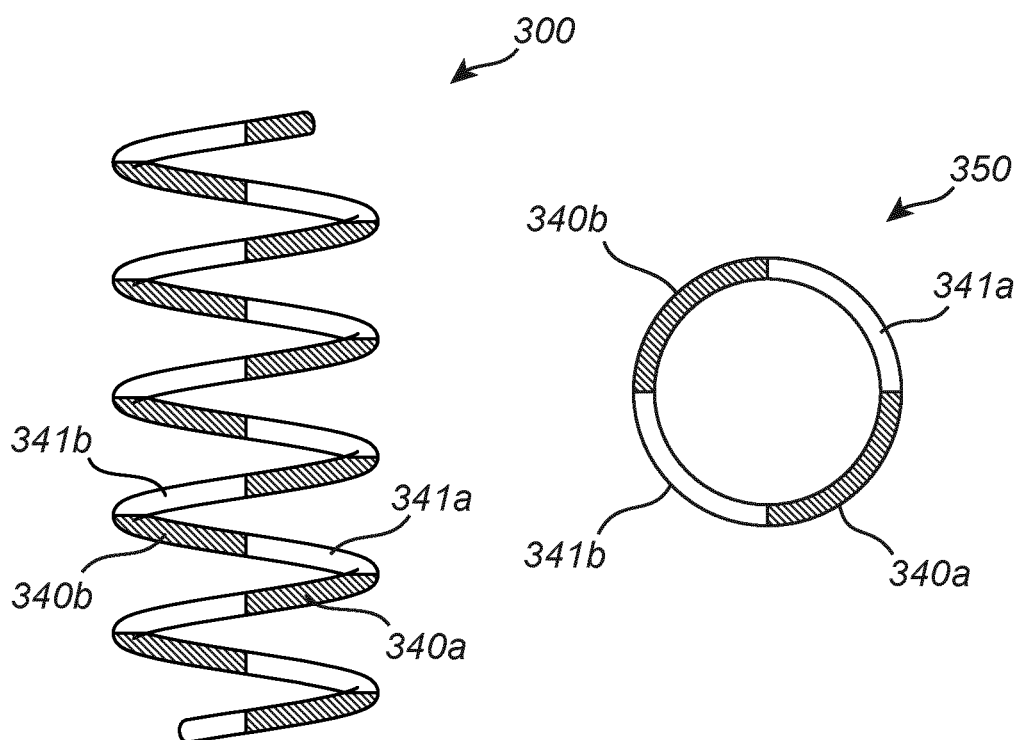
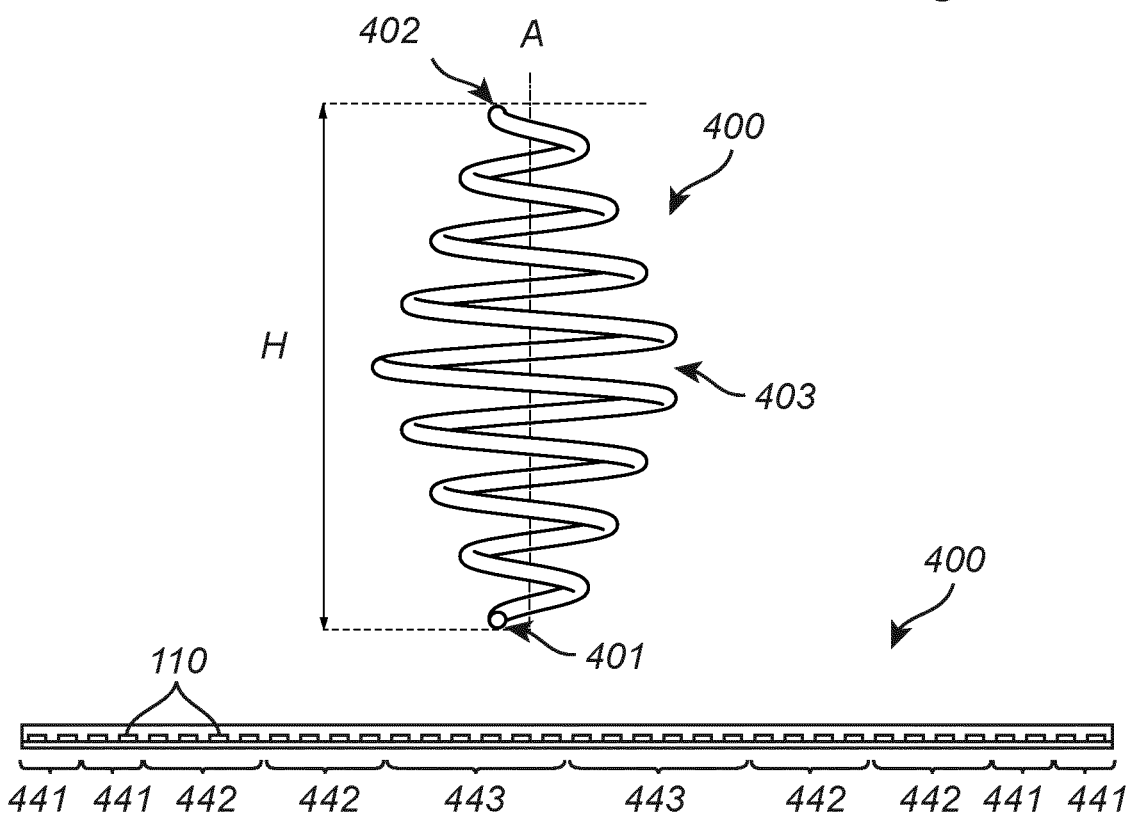
Fig. 3
Fig. 4

BEAM SHAPING FOR SPIRAL LED FILAMENT SYSTEMS

CROSS-REFERENCE TO PRIOR APPLICATIONS

This application is the U.S. National Phase application under 35 U.S.C. § 371 of International Application No. PCT/EP2020/081902, filed on Nov. 12, 2020, which claims the benefit of European Patent Application No. 19210518.7, filed on Nov. 21, 2019 and European Patent Application No. 20156523.1, filed on Feb. 11, 2020. These applications are hereby incorporated by reference herein.

TECHNICAL FIELD

The present disclosure relates generally to the field of solid-state lighting. Specifically, it relates to a light-emitting (LED) filament system comprising a spiral-shaped LED filament including a plurality of LEDs arranged in sections, and a controller.

BACKGROUND

Incandescent lamps are rapidly being replaced by light-emitting diode (LED) based lighting solutions. Solid state lighting devices may provide many advantages over their incandescent, fluorescent, and gas-discharge based counterparts. For instance, they may provide increased operational life, reduced power consumption and higher efficacy. Solid state lighting devices, such as LEDs, are employed in a wide range of lighting applications.

Development of LED-based lighting devices is ever ongoing and may provide new solutions extending far beyond what has been possible using conventional light sources.

SUMMARY

One general aim of the present disclosure is to provide even more versatile LED-based lighting solutions. Specifically, there is a desire to be able to provide LED filament systems allowing for customizable light distribution.

It is therefore an object of the present invention to meet at least some of the above-mentioned goals, and to provide improved LED-based lighting.

This and other objects are achieved by means of a LED filament system as defined in the appended independent claim. Other embodiments are defined by the dependent claims.

According to a first aspect of the present disclosure, a light-emitting diode (LED) filament system is provided. The LED filament system comprises a LED filament and a controller. The LED filament comprises a carrier arranged in the shape of a spiral formed by successive loops. A plurality of LEDs is arranged in a linear array on a side of the carrier. Specifically, the LEDs are arranged in sections, each section having a position along the spiral-shaped carrier. The controller is configured to control a power supply to a section of the LED filament, or to a group of sections of the LED filament. The controller is further adapted to control (power supply to) a section based on its position, or (power supply to) a group of sections based on the positions of the sections of the group.

The carrier forms a spiral shape by winding in a continuous curve about a central axis. A loop is formed by a portion of the carrier winding 360 degrees around the central axis. A first end portion of a loop (a starting portion) may be separated in a direction along the central axis from a second end portion of the loop (an end portion), i.e. the first end portion and the second end portion are located at two different positions (heights) along the length of the spiral.

The plurality of LEDs is arranged in a linear array on one side of the carrier. For example, the LEDs may be arranged in one row along the carrier. Alternatively, the LEDs may be arranged in two or more rows along the carrier. In case the LEDs are arranged in a plurality of rows along the carrier, the rows may be at least substantially parallel. The LEDs may be arranged with a substantially constant pitch (distance between successive LEDs). It will be appreciated that LEDs may be arranged on several sides of the carrier. For example, the LED filament may comprise a second plurality of LEDs arranged on a second, opposite, side of the carrier.

Lighting devices comprising spiral-shaped LED filaments are highly appreciated as they have a decorative look. Spiral-shaped LED filaments comprising individually controllable sections (i.e. sections to which power supply is individually controllable by a controller) or sections which may be controlled as groups may provide customizable light-distribution.

According to an embodiment, the LEDs of a section may be controllable by the controller to emit light with a variable intensity. For example, the controller may control a section to provide a first intensity I1, and another section to provide a second intensity I2. The first intensity I1 may be at least twice as high as the second intensity I2 (I1>2I2). Specifically, the first intensity I1 may be at least three times as high as the second intensity I2 (I1>3I2). More specifically, the first intensity I1 may be at least four times as high as the second intensity I2 (I1>4I2)

Many different types of LEDs may be used to provide sections with variable intensity. For example, the plurality of LEDs may comprise LEDs configured to emit blue light. Alternatively, or additionally, the plurality of LEDs may comprise LEDs configured to emit ultraviolet (UV) light. For the LED filament to provide white light, the LEDs may be covered with an encapsulant comprising a wavelength converting material, such as a luminescent material. Alternatively, the LEDs may be individually covered with wavelength converting material.

The wavelength converting material may absorb at least some of the light emitted by the LEDs, and emit light having a different wavelength. Types of LEDs and wavelength converting materials may be selected for the LED filament to provide light with a desired color or color temperature. An encapsulant covering at least the LEDs may comprise a light-scattering material. Light-scattering materials may for example include particles of barium sulfate ($BaSO_4$), aluminum (III) oxide ($Al_2O_3$) and/or titanium dioxide ($TiO_2$). A LED filament having sections in which LEDs may be controllable to emit light with a variable intensity may provide the possibility of beam sweeping, a lighting effect in which successive sections are illuminated with a higher intensity. This may provide the appearance that a light beam travels around the LED filament.

According to some embodiments, the LEDs of a section may be controllable by the controller to emit light with variable color.

Various types of LEDs may be used to provide sections having variable color. For example, the plurality of LEDs may comprise red, green, and blue LEDs. Light from red, green, and blue LEDs may be combined at different intensities to form a large variety of colors. Alternatively, the plurality of LEDs may comprise LEDs providing white light of different color temperature. For example, the plurality of LEDs may comprise a first plurality of LEDs arranged to provide white light with a first, warmer, white tone (e.g. light with a lower correlated color temperature), and a second plurality of LEDs arranged to provide white light with a second, colder, white tone (e.g. light with a higher correlated color temperature). The powering to the different types of LEDs may be controllable such that the color and/or color temperature of light emitted by a section may be adapted. Such embodiments may provide LED filaments allowing for different color patterns. For example, such embodiments may allow for a color gradient (gradual transition between colors) in the light provided by a LED filament. According to some embodiments, the position of a section may be defined be a height and an angle. The height of a section (i.e. the position of the section along the height of the spiral-shaped carrier) may be related to a distance from an end portion of the LED filament along a central axis (or a longitudinal axis) of the spiral shape. The angle of a section (i.e. the position of the section along the circumference of the spiral-shaped carrier) may be related to the position of the section along a loop relative to a starting point of the loop.

The angle of the section may be the angle formed between a ray drawn from a beginning of the loop to the central axis and a ray drawn from a beginning of the section to the central axis.

According to some embodiments, a loop of the spiral may comprise N sections. The number N of sections within a loop, may be in the range 2-8.

For example, the number N of sections within a loop may be in the range 3-7. More specifically, the number N may be in the range 4-6.

For embodiments in which each loop comprises more than one section, the light-distribution of the LED filament may be asymmetrically controlled. For instance, sections corresponding to one half of each loop may be illuminated with a higher intensity and/or a different color than the other half, providing that the illumination to one side of the LED filament is different than the illumination to the other side. More sections within a loop may provide more variability to the light-distribution of the LED filament.

For example, in embodiments in which N is at least 2, a section may be controlled (by the controller) to provide a first intensity I1, and another section may be controlled to provide a second intensity I2. A difference between the first intensity I1 and the second intensity I2 may be at least 40%.

In embodiments in which N is at least 4, two sections arranged at opposite sides of a loop (such as at the front and the back of the LED filament) may be controlled (by the controller) to provide a higher intensity than other sections of the loop.

In embodiments in which each loop comprises one section, the loops may be individually controllable or be arranged in controllable groups. Such embodiments may provide a different light-distribution along a direction of the central axis. For example, the controller may control powering to the loops individually such that the intensity and/or color of one loop is different from the intensity and/or color of a different loop.

Further, different embodiments may comprise different numbers of loops. In embodiments which comprise at least four loops, sections positioned in loops at one end portion of the LED filament may be controlled to provide a higher intensity than sections positioned in loops at the other end portion of the LED filament.

Controlling the LED filament such that individual sections are being illuminated and switched off according to a defined pattern may be referred to as beam shaping. The LED filament may be used together with a reflector to provide beam shaping.

According to some embodiments, the sections may comprise at least a first set of sections and a second set of sections. The sections of the first set and the sections of the second set may be arranged along the carrier in a repetitive manner.

For example, in embodiments comprising a first set of sections and a second set of sections, the sections of the first set and the sections of the second set may be alternatingly arranged along the carrier.

The sections of the first set may be different from the sections of the second set. The sections of the first set and the sections of the second set may for instance provide light with different color temperatures. For example, the sections of the first set may have a thicker encapsulant layer than the sections of the second set. A thicker encapsulant layer comprising a wavelength converting material may provide that a larger portion of the light emitted by the LEDs is converted (i.e. absorbed by the wavelength converting material and re-emitted with a different wavelength). Alternatively, or additionally, the sections of the first set may comprise a different type of wavelength converting material than the sections of the second set, either arranged in an encapsulant covering at least the LEDs or individually covering the LEDs.

As a third option, the sections of the first set may comprise a higher concentration of wavelength converting material than the sections of the second set, either arranged in an encapsulant covering at least the LEDs or individually covering the LEDs.

Further, the sections of the first set may comprise a different type of LEDs than the sections of the second set.

It will be appreciated that embodiments comprising a first set of sections and a second set of sections may further comprise further sets of sections, for example a third set of sections. In such embodiments, the sections from the different sets may be arranged along the carrier in a repetitive manner. For example, the sections may be arranged in a pattern in which a section of the first set is followed by a section of the second set, which is in turn followed by a section of the third set, and the pattern is repeated along the carrier.

According to some embodiments, each loop of the spiral-shaped LED filament may comprise the same number of sections.

According to some embodiments, each loop may comprise N sections. Further, the N borders between the N sections of a loop may be aligned with the N borders between the N sections of a successive loop, along the height of the spiral-shaped carrier.

In embodiments in which the sections are aligned along the height of the spiral-shaped carrier (or along the central axis of the spiral-shape), advanced patterns in the illumination of the LED filament may be achieved.

In embodiments in which each loop comprises two sections: a first section and a second section, the first sections of the loops may be aligned (i.e. placed over one another in the spiral arrangement of the sections), and the second sections of the loops may be aligned. In such embodiments all the first sections may be illuminated, followed by illumination of all the second sections. When the second sections are illuminated, the first sections may be switched off. In such embodiments, the first sections may form a first set, the second sections may form a second set and the third sections may form a third set.

In embodiments in which the number N of sections within each loop is larger than or equal to three, the first sections of the loops may be aligned, the second sections of the loops may be aligned, the third sections of the loops may be aligned etc. In such embodiments all the first sections may be illuminated during a first period of time, followed by illumination of all the second sections during a second period of time (successive the first period of time), which may be followed by illumination of the third sections, etc. When the second sections are illuminated, the first sections may be switched off. When the third sections are illuminated, the first sections and/or the second sections may be switched off, etc. Successively illuminating and switching off successive groups of aligned sections may result in beam sweeping.

According to some embodiments, a radius of the loops of the spiral may vary along a height of the spiral-shaped carrier (i.e. along the central axis).

For example, the loops at end portions of the LED filament may have a smaller radius than loops located in the middle of the LED filament (i.e. between said end portions), thereby providing the LED filament with a barrel shape.

Alternatively, the loops at end portions of the LED filament may have a larger radius than loops between said end portions. In such embodiments, the spiral-shaped filament may have a generally hourglass or diabolo shape. In a further option, the radius of the loops successively increases/decreases from one end of the spiral shape to another.

According to some embodiments, a length of a section in a loop having a smaller radius may be shorter than a length of a section in a loop having a larger radius.

For example, the length of the sections of the different loops may be adapted such that each loop comprises the same number of sections.

In embodiments in which all loops have the same radius, the sections may have the same length. According to some embodiments, each section may comprise at least two LEDs.

In embodiments in which each section comprises more than one LED (i.e. at least two LEDs), the individual sections may provide a larger flux.

In individually controllable sections that comprise only one LED, the LEDs are effectively individually controllable.

Alternatively, in embodiments in which the length of the sections may vary, some sections may comprise one LED, while other sections may comprise more than one LED.

According to some embodiments, the LEDs of a section may be electrically connected in series.

Embodiments in which the LEDs of a section are electrically connected in series may be more convenient to produce, as a less complicated system of electrical connections is needed. Further, the intensity of the entire section may be controlled together if the LEDs within the section are serially connected. Alternatively, the LEDs may be individually controllable, or different groups of LEDs within the section may be separately controllable. For example, in embodiments in which a section comprises LEDs providing light with different colors, LEDs within the section which provide the same color may be electrically connected in series. In such embodiments, the color of the section may be controlled by controlling the powering to, and thus the intensity emitted by, the LEDs of different colors within the section.

For example, within a section, some LEDs may be electrically connected in series, and some LEDs may be electrically connected in parallel. It will be appreciated that the power-supply to a section (within which the LEDs may be serially and/or parallel connected) may be controlled by a controller. In embodiments in which the LEDs within a section are individually controllable, illumination patterns may also be adapted within each section.

According to some embodiments, the controller may be configured to control a power supply to a first section, or to a first group of sections, differently than a power supply to a second section, or to a second group of sections.

According to some embodiments, the controller may be configured to control the powering of the sections of the LED filament such that the luminous flux of the LED filament is substantially constant over time.

In such embodiments, the LED filament may provide the same amount of illumination over time, but the direction and/or pattern of illumination may vary. Such illumination effects may be especially desirable in effect lighting for events.

It will be appreciated that the luminous flux may not be constant every time the LED filament system is in use. Rather, by "constant over time" it is meant constant over a certain period of time. For example, the amount of luminous flux may be a setting provided by the controller.

Alternatively, or additionally, a similar setting may be available for color. The controller may be configured to provide a constant total amount of light with different wavelengths (colors), wherein the directions in which the light with a specific color is emitted may vary.

According to some embodiments, the controller may be configured to control the powering of the sections, or the groups of sections, of the LED filament based on a desired direction of light-emission.

For example, the controller may control the powering of the sections, or the groups of sections, such that sections which emit light in a desired direction are turned on, and other sections are turned off. The direction of light-emission of a section may be dependent on the position of the section. For example, in embodiments in which the LEDs are arranged on a side of the carrier which faces away from the central axis of the spiral shape, the LEDs may emit light in directions away from the central axis.

For example, the controller may be adapted to control/address the sections of the LED filament based on the height and angle of the section. In such embodiments, sections of all heights within a certain angle range, i.e. sections located at the same position along the circumference of the spiral-shaped carrier but at different heights, may be illuminated with a specific illumination pattern.

According to a second aspect of the present disclosure, a lighting device is provided. The lighting device may comprise a LED filament system as described with reference to any embodiment of the second aspect. The lighting device may further comprise an at least partially light-transmissive envelope. The envelope may at least partially envelop at least the LED filament of the LED filament system. The lighting device may further comprise a base on which the envelope may be mounted. The base may be further adapted for connection with a luminaire socket.

The lighting device may be a LED filament lamp. Light emitted by the LEDs of the LED filament may be referred to as LED light. Light emitted by the LEDs, absorbed by a wavelength converting material, and reemitted at a different wavelength may be referred to as converted light. Thus, the light provided by the LED filament (LED filament light) may comprise a combination of LED light and/or converted light. The at least partially light-transmissive envelope is adapted to transmit the LED filament light. Thus, the LED filament lamp may provide LED filament lamp light, which may in turn comprise LED filament light. The lighting device may have a longitudinal axis. The longitudinal axis may for example extend substantially orthogonally to a surface of the base.

The central axis of the spiral-shaped LED filament may be substantially parallel to the longitudinal axis of the lighting device.

Alternatively, the central axis of the spiral-shaped LED filament may be substantially perpendicular to the longitudinal axis of the lighting device.

It is noted that other embodiments using all possible combinations of features recited in the above described embodiments may be envisaged. Thus, the present disclosure also relates to all possible combinations of features mentioned herein.

BRIEF DESCRIPTION OF DRAWINGS

Exemplifying embodiments will now be described in more detail, with reference to the following appended drawings:

FIG. 3 shows a side view of a LED filament arranged in a spiral-shape having alternating first and second sections, and a plan view of a loop of the LED filament, in accordance with some embodiments;

FIG. 4 shows a side view of a LED filament arranged in a spiral-shape in which the radius of the loops varies along the height of the spiral, and a side view of the LED filament in an extended state, in accordance with some embodiments;

As illustrated in the figures, the sizes of the elements and regions may be exaggerated for illustrative purposes and, thus, are provided to illustrate the general structures of the embodiments. Like reference numerals refer to like elements throughout.

DETAILED DESCRIPTION

Exemplifying embodiments will now be described more fully hereinafter with reference to the accompanying drawings in which currently preferred embodiments are shown. The invention may, however, be embodied in many different forms and should not be construed as limited to the embodiments set forth herein; rather, these embodiments are provided for thoroughness and completeness, and fully convey the scope of the invention to the skilled person.

Figure 1:
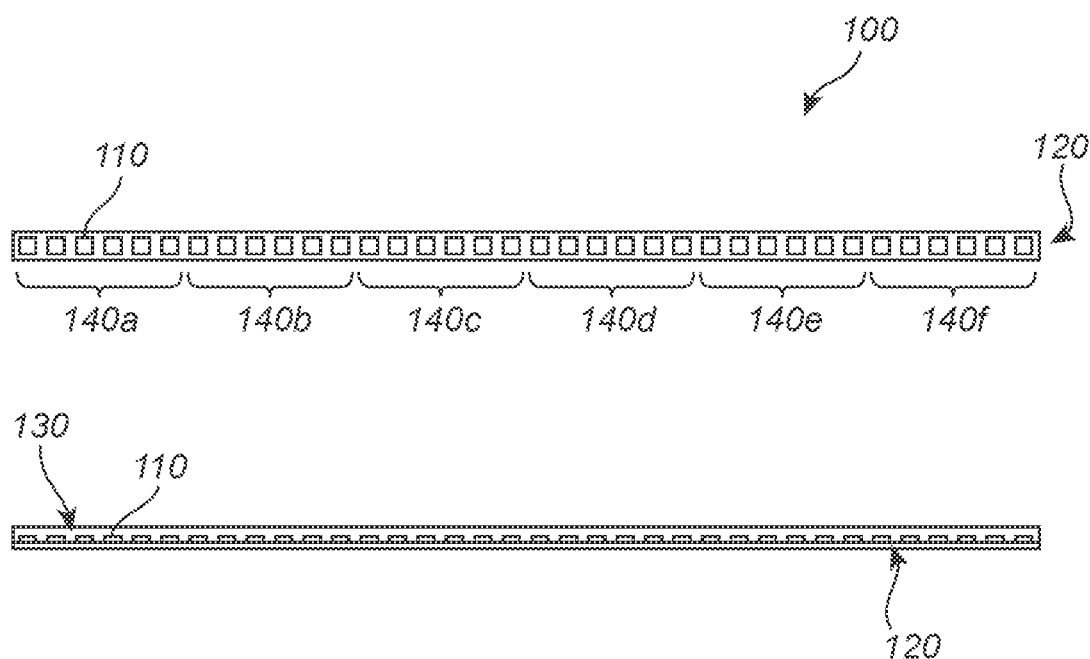
FIG. 1 shows a plan view and a side view of a LED filament, in accordance with some embodiments.

With reference to FIG. 1, a LED filament 100 in accordance with some embodiments will be described.

FIG. 1 shows a plan view of a LED filament 100, and a side view of the same LED filament 100. In FIG. 1, the LED filament 100 is extended in a straight configuration, for illustrative purposes.

The LED filament 100 comprises a carrier 120. The carrier 120 may be flexible such that it may be wound into a spiral shape. However, a rigid carrier which may be shaped as a spiral may also be used. A plurality of LEDs 110 is arranged in a linear array on a side of the carrier 120. Specifically, the LEDs 110 are arranged in a single row along the carrier 120. The LEDs 110 are arranged in sections 140a-f. The sections 140a-f are individually controllable, in that powering to the LEDs 110 within each section 140a-f may be controlled by a controller. In other words, one of the sections 140a-f may be separately controlled from the other sections such that, for example, a power supplied to the LEDs of a first section 140a may be different from a power supplied to the LEDs of a second section 140b.

Further, as represented in the side view, the LED filament 100 comprises an encapsulant 130. The encapsulant 130 covers the plurality of LEDs 110, and the side of the carrier 120 on which the LEDs 110 are arranged. The encapsulant 130 may comprise wavelength converting material and/or light-scattering material. In embodiments in which the encapsulant 130 comprises wavelength converting material, the wavelength converting material may itself have a light-scattering effect.

The color of the light emitted by the LED filament 100 may be affected by the type of LEDs 110 and the type of encapsulant 130 used for the LED filament.

For example, the LED filament 100 may be arranged to emit white light with a single color temperature, for which the intensity of the different sections 140a-f may be controlled. In such embodiments, the LEDs 110 may be LEDs adapted to emit blue and/or UV light, such LEDs may provide a high efficiency. The encapsulant 130 may comprise a wavelength converting material such as yellow and red phosphors. Light converted by the phosphors may together with non-converted light from the LEDs form white light. Alternatively, the LEDs 110 may comprise a combination of blue and red LEDs. In such embodiments, the wavelength converting material may partially convert the blue light to form white light.

Alternatively, the LED filament 100 may be arranged to emit white light with a variable color temperature and/or a variable intensity. In such embodiments, the LEDs 110 may comprise LEDs of at least two different types. LEDs of the first type may be arranged to emit white light of a first color temperature, and LEDs of the second type may be arranged to emit white light with a second color temperature, different from the first color temperature.

Furthermore, to provide intensity and/or color control, the LEDs 110 may comprise a combination of red, green, and blue LEDs. In such embodiments, the encapsulant may comprise light-scattering material.

It will be appreciated that a LED filament, in general, provides LED filament light and comprises a plurality of light-emitting diodes (LEDs) arranged in a linear array. Preferably, the LED filament has a length LF and a width W, wherein LF>5W. The LED filament may be arranged in a non-straight configuration such as for example a curved configuration, a 2D/3D spiral or a helix. Preferably, the LEDs are arranged on an elongated carrier like for instance a substrate, that may be rigid (made from e.g. a polymer, glass, quartz, metal or sapphire) or flexible (e.g. made of a polymer or metal e.g. a film or foil).

In case the carrier comprises a first major surface and an opposite second major surface, the LEDs are arranged on at least one of these surfaces. The carrier may be reflective or light transmissive, such as translucent or transparent. Specifically, the carrier may be semi-reflective.

The LED filament may comprise an encapsulant at least partly covering at least part of the plurality of LEDs. The encapsulant may also at least partly cover at least one of the first major or second major surface. The encapsulant may be a polymer material which may be flexible such as for example a silicone. Further, the LEDs may be arranged for emitting LED light e.g. of different colors or spectrums. The encapsulant may comprise a luminescent material that is configured to at least partly convert LED light into converted light. The luminescent material may be a phosphor such as an inorganic phosphor and/or quantum dots or rods.

Figure 2:
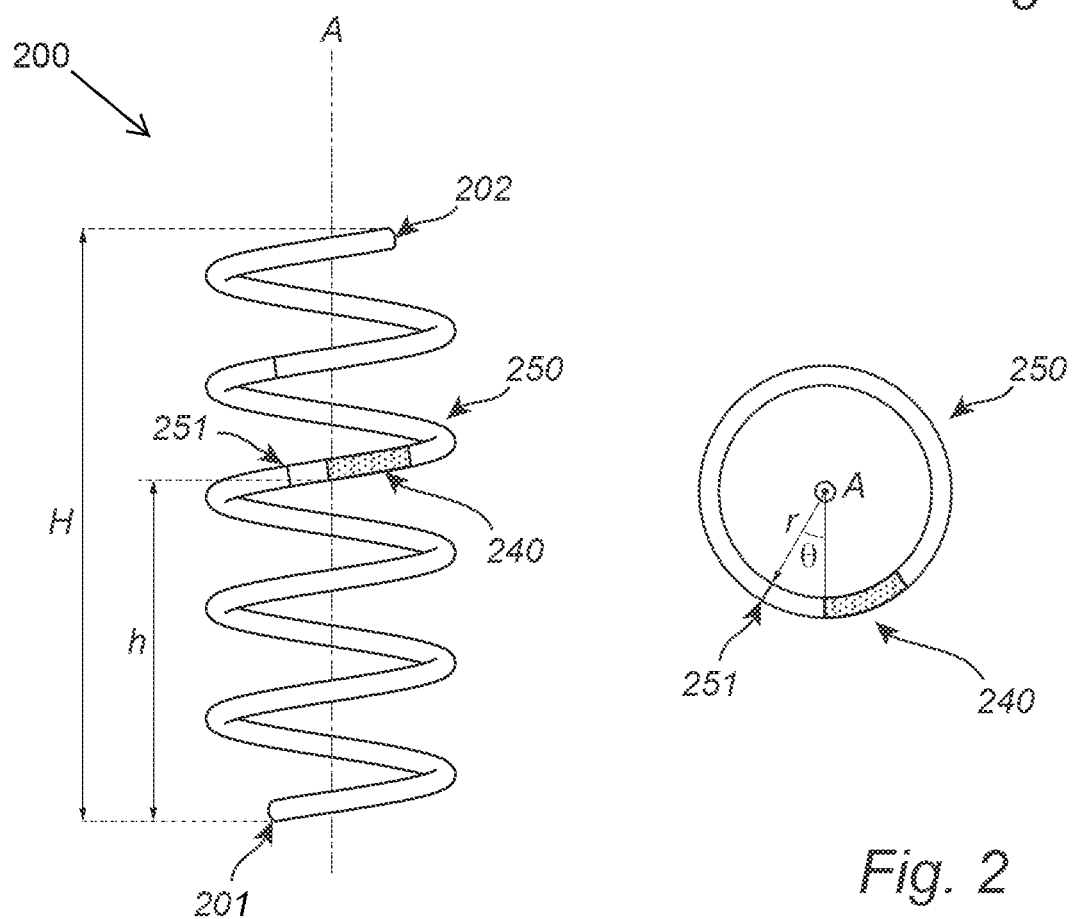
FIG. 2 shows a side view of a LED filament arranged in a spiral-shape formed by successive loops, and a plan view of a loop, in accordance with some embodiments.

The LED filament may comprise multiple sub-filaments. With reference to FIG. 2, a LED filament 200 arranged in the shape of a spiral, in accordance with some embodiments, will be described.

FIG. 2 shows an illustration of a LED filament 200 arranged in a spiral shape. The LED filament 200 may be equivalent to the LED filament 100 described with reference to FIG. 1 except that it is arranged in a different shape. The LED filament 200 may include a rigid carrier or a flexible carrier as long as it can be shaped as a spiral. The spiral extends along a central axis A. For illustrative purposes, the LED filament 200 is depicted having the shape of a uniform cylinder. This appearance may be achieved by embedding the LEDs and the carrier in the encapsulant, such that the encapsulant covers all sides of the carrier.

The LED filament 200 may be arranged such that the surface of the carrier on which the LEDs are arranged is facing away from the central axis A. Further, the LEDs may be arranged such that a light-emitting surface of each LED is facing away from the central axis A. Thus, a large portion of the light emitted by the LED filament 200 may be directed away from the LED filament 200.

In embodiments in which the carrier is (partially) light-transmissive, the LED filament 200 may be arranged such that 60-90% of the LED filament light is emitted in a direction away from the central axis A. For example, the LED filament 200 may be arranged such that the surface of the carrier on which the LEDs are arranged, and/or a light-emitting surface of each LED, is facing away from the central axis A. Alternatively, or additionally, a semi-reflective carrier may be used.

The LED filament 200 winds in successive loops 250 around the central axis A, with a substantially constant radius r. A loop 250 is also shown, viewed from above. A loop 250 is formed by a portion of the LED filament 200 which winds 360 degrees around the central axis A.

The spiral-shaped LED filament has a height H, which corresponds to a distance along the central axis from a first end portion or first extremity 201 of the LED filament 200 to a second end portion or second extremity 202 (opposite to the first extremity 201) of the LED filament 200.

Also depicted is one of the sections 240. The position of the section 240 can be defined or described by a height h of the section 240 and an angle θ of the section 240. The height h of the section is the distance along the central axis from the first end portion 201 to the section 240. The angle θ of the section 240 is the angle formed between a ray drawn from the beginning 251 of the loop 250 to the central axis A and a ray drawn from the beginning of the section 240 to the central axis A.

With reference to FIG. 3, a LED filament comprising a first set of sections and a second set of set of sections, in accordance with some embodiments, will be described. FIG. 3 shows a sideview of a LED filament 300 and a plan view of one of the loops 350 of the LED filament 300. The LED filament 300 may be equivalent to the LED filament 200, described with reference to FIG. 2, except that it comprises a first set of sections 340a-b, and a second set of sections 341a-b. The sections 340a-b of the first set and the sections 341a-b of the second set are alternatingly arranged along the LED filament 300. Specifically, each loop 350 comprises two sections 340a-b of the first set and two sections 341a-b of the second set. Furthermore, the sections of the different loops are aligned in a direction along the central axis of the spiral-shaped LED filament 300. For instance, one of the sections 340a of the first set of the loop 350 is aligned with a section of the first set of each of the other loops. In the figure, the section 340a of the first set of the loop 350 is aligned with a section of the first set of each of the other loops.

The LED filament 300 may be controlled to perform beam sweeping. Such a lighting effect may be achieved by successively illuminating sections arranged in sequential angular ranges. For example, first, a first section 340a in each loop may be illuminated. The other sections 341a, 340b, and 341b may either be turned off, or they may be illuminated with a lower intensity than the first section 340a. In this first instance, most of the light emitted by the LED filament 300 will be directed in the direction of the first section 340a, e.g. in a range from 0 to 90 degrees.

Secondly, a second, adjacent, section 341a in each loop may be illuminated. The other sections 340a, 340b, and 341b may once again be either turned off, or illuminated with a lower intensity than the second section 341a. Most of the light emitted by the LED filament 300 will now be directed in the direction of the second section 341a, e.g. in a range from 90 to 180 degrees.

Next, a third section 340b in each loop, adjacent to the second section 341a, may be illuminated, while the other sections are turned off or dimmed. Most of the light emitted by the LED filament 300 will then be directed in the direction of the third section 340b, e.g. in a range from 180 to 270 degrees.

Finally, a fourth section 341b in each loop, adjacent to the third section 340b, may be illuminated, while the other sections are turned off or dimmed (i.e. illuminated with a lower intensity). Most of the light emitted by the LED filament 300 will then be directed in the direction of the fourth section 341b, e.g. in a range from 270 to 360 degrees.

If this process is performed repeatedly, the beam of light emitted by the LED filament may be perceived as sweeping around the LED filament 300. During this process, the controller may be adapted to control the illumination of the sections such that the luminous flux of the LED filament 300 remains substantially constant over time, as the beam sweeps around the LED filament.

The sections 340a-b of the first set may further be configured to emit light with a different color temperature than the sections 341a-b of the second set. In such embodiments, the color temperature of the light emitted by the LED filament may be adjusted by adapting the intensity of the light emitted by the sections 340a-b of the first set and the sections 341a-b of the second set.

With reference to FIG. 4, a LED filament 400 in which the radius of the loops varies along the height of the LED filament, in accordance with some embodiments, will be described. FIG. 4 shows a side view of a LED filament 400 having a spiral-shape, and a side view of the same LED filament 400 in an extended configuration. The LED filament 400 may be equivalent to the LED filament 200 described with reference to FIG. 2, except that the radius r of the loops varies along the height H of the LED filament 400.

The LED filament 400 winds around a central axis A. The radius r of the loops increases along the height h from a first end portion 401 towards a center portion 403 of the LED filament 400. The radius r of the loops decreases again along the height H from the center portion 403 towards the second end portion 402 of the LED filament 400.

In the extended version of the LED filament 400, the different sections 441, 442, 443 of the LED filament 400 are illustrated. Near the end portions 401, 402, the sections 441 have a shorter length. The length of the sections increases towards the center portion 403 of the LED filament. Specifically, each loop of the LED filament 400 comprises two sections of equal length.

Figure 5:
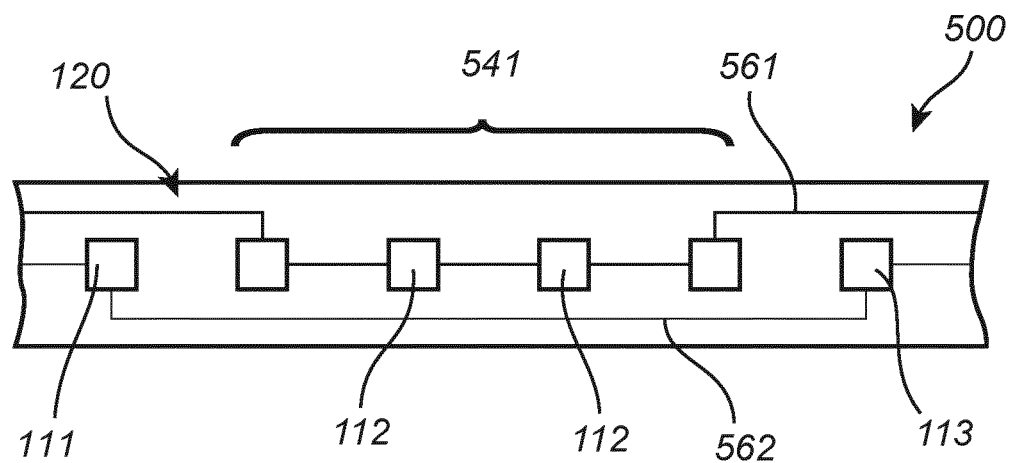
FIG. 5 shows a section of the LED filament in which the LEDs are electrically connected in series, in accordance with some embodiments.

With reference to FIG. 5, a section 541 of the LED filament 500 in which the LEDs 112 are electrically connected in series, in accordance with some embodiments, will be described.

FIG. 5 is an illustration of a part of a LED filament 500. The LED filament 500 may be equivalent to any of the LED filaments 100-400 described with reference to the preceding figures.

FIG. 5 shows a section 541 of the LED filament 500 comprising four LEDs 112. A LED 111 from a section to the left of the section 541 and a LED 113 of a section to the right of the section 541 are also shown. The LEDs 112 are electrically connected in series via the first electrical connector 561. Thus, the intensity of the LEDs 112 of the section 541 may be controlled simultaneously by controlling the powering of the LEDs 112 via the first electrical connector 561. Furthermore, the LEDs 111, 113 from the adjacent sections are connected in series via the second electrical connector 562.

Figure 6:
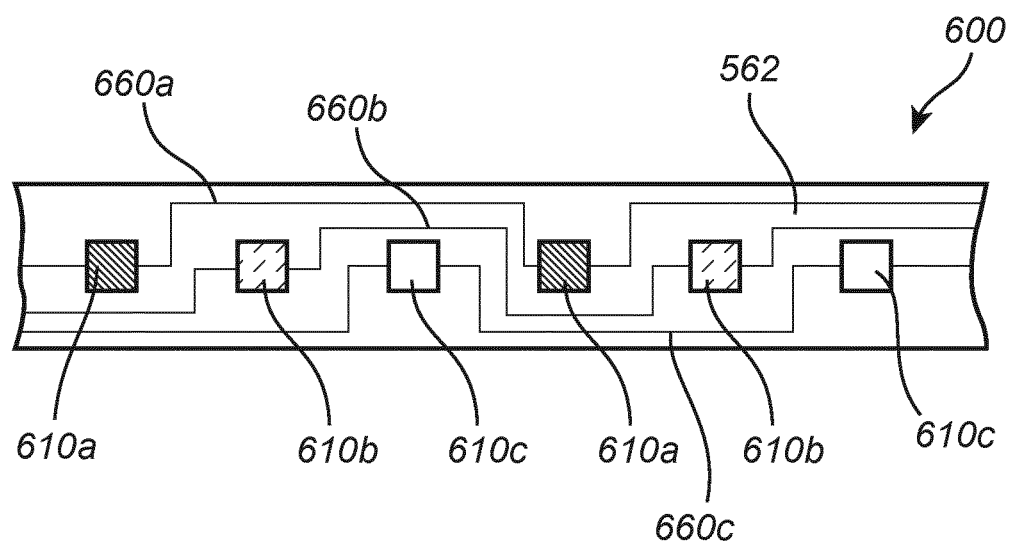
FIG. 6 shows a section of the LED filament in which the LEDs of each type are electrically connected in series, in accordance with some embodiments.

With reference to FIG. 6, a section 640 of a LED filament comprising red LEDs 610a, green LEDs 610b, and blue LEDs 610c, in accordance with some embodiments, will be described. FIG. 6 shows a section 640 of a LED filament. The LED filament may be equivalent to any of the LED filaments 100-400 described with reference to FIGS. 1-4, except that it comprises red, green and blue LEDs.

In the section 640, two red LEDs 610a, two green LEDs 610b, and two blue LEDs 610c are arranged in a single row on the substrate. The two red LEDs 610a are electrically connected in series via the first electrical connector 660a. The two green LEDs 610b are electrically connected in series via the second electrical connector 660b. The two blue LEDs 610c are electrically connected in series via the third electrical connectors 660c. Connecting the LEDs of the same type (color) in series may allow for the intensity of the LEDs to be controlled at the same time. Thus, the powering of the red LEDs 610a, the green LEDs 610b, and the blue LEDs 610c may be controlled separately. By controlling the powering of the LEDs, the intensity of the light emitted by the LEDs may be controlled. Controlling a ratio of intensity between the different types (colors) of LEDs, the color of the combined light emitted by the section 641 may be controlled.

Figure 7:
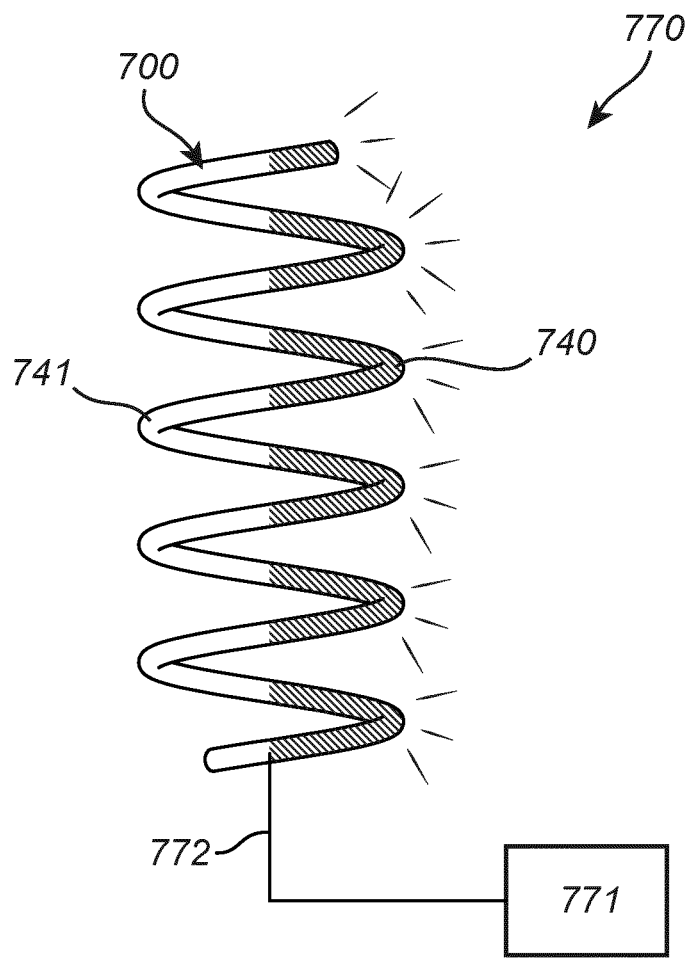
FIG. 7 is a schematic illustration of a LED filament system, in accordance with some embodiments.

With reference to FIG. 7, a LED filament system, in accordance with some embodiments, will be described.

FIG. 7 shows a LED filament system 770 comprising a LED filament 700 and a controller 771. The LED filament 700 may be equivalent to any of the LED filaments described above with reference to the preceding figures. The controller 771 is connected to the LED filament 700 by means of an electrical connection 772.

Each loop of the spiral-shaped LED filament 700 comprises a first section 740 and a second section 741. The first sections 740 of the different loops are aligned along the height of the LED filament 700, and the second sections 741 of the different loops are aligned along the height of LED filament. The controller 771 is configured to control the powering of the sections 740, 741. In the illustration, the controller 771 is controlling the first sections 740 to be illuminated, and the second sections 741 to be turned off (not illuminated). As a result, light emitted by the LED filament is distributed mostly to one side of the LED filament (e.g. in a range from 0 to 180 degrees).

The controller 771 may first control all the first sections 740 (which are aligned) to be illuminated. Next, the controller 771 may control all the second sections 741 to be illuminated. While the second sections 741 are illuminated, the first sections 740 may be switched off. This control pattern may be repeated.

The first sections 740 may form a first set of sections, and the second sections 741 may form a second set of sections.

Figure 8:
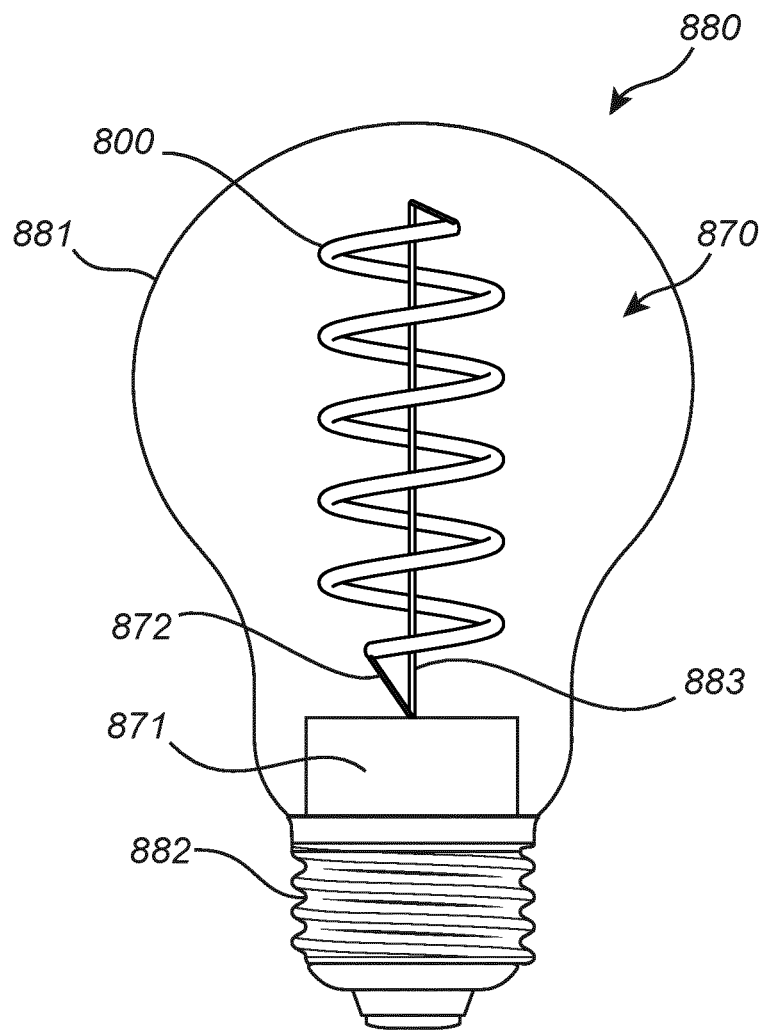
FIG. 8 is a schematic illustration of a lighting device, in accordance with some embodiments.

With reference to FIG. 8, a lighting device 880 in accordance with some embodiments will be described.

FIG. 8 is a side view of a lighting device 880 in accordance with some embodiments. The lighting device 880 comprises a LED filament system 870, which may be equivalent to the LED filament system 770 described with reference to FIG. 7. The lighting device further comprises an at least partially light-transmissive envelope 870. The LED filament 800 of the LED filament system 870 is arranged within the envelope 881. In other words, the envelope 881 envelops the LED filament 800.

Further, the lighting device comprises a base 882, on which the envelope 881 is mounted. In the present embodiment, the controller 871 of the LED filament system 870 is arranged on the base 882 and within the envelope 881. In other embodiments, the controller 871 may be arranged within the base 882. Electrical connectors 872 connect the LED filament 800 with the controller 871.

The base 882 is adapted to be connected to a luminaire socket. Specifically, the base 882 is adapted to be connected to a socket of Edison type.

A holding structure 883 is also mounted on the base 882 for holding the LED filament 800 in place within the lighting device 880. The spiral-shaped LED filament 800 is arranged with its central axis parallel to a longitudinal axis of the lighting device 880.

The person skilled in the art realizes that the present invention by no means is limited to the preferred embodiments described above. On the contrary, many modifications and variations are possible within the scope of the appended claims.

Although features and elements are described above in particular combinations, each feature or element can be used alone without the other features and elements or in various combinations with or without other features and elements.

Additionally, variations to the disclosed embodiments can be understood and effected by the skilled person in practicing the claimed invention, from a study of the drawings, the disclosure, and the appended claims. In the claims, the word "comprising" does not exclude other elements, and the indefinite article "a" or "an" does not exclude a plurality.

The mere fact that certain features are recited in mutually different dependent claims does not indicate that a combination of these features cannot be used to advantage.

The invention claimed is:

1. A light-emitting diode (LED) filament system comprising:
   a LED filament comprising:
   a carrier arranged in the shape of a spiral formed by successive loops;

a plurality of LEDs arranged in a linear array on one side of said carrier;

wherein said LEDs are arranged along the carrier in sections, each section has a position along the spiral-shaped carrier, wherein the LEDs are arranged in a single linear array on the one side of the carrier, and each section includes a respective entire predetermined length of the carrier that includes two or more LEDs; and a controller configured to control a power supply to a section, or to a group of sections, of the LED filament;

wherein said controller is adapted to control a section or a group of sections using the position or positions of the section or group, wherein the position or positions are determined using a height and an angle of said section or group along the spiral-shaped carrier, wherein said height is a distance from an end portion of the LED filament to the section along a central axis (A) of the spiral shape, and said angle is the position of the section along a loop relative to a starting point of the loop, and wherein each loop of the LED filament comprises N sections, and wherein N borders between said N sections of a loop are vertically aligned with N borders between N sections of a successive loop, along the height of the spiral-shaped carrier.

2. The LED filament system of claim 1, wherein LEDs of a section are controllable by said controller to emit light with a variable intensity.

3. The LED filament system of claim 1, wherein LEDs of a section are controllable by said controller to emit light with variable color.

4. The LED filament system of claim 1, wherein said number N of each section of each loop of the spiral is in a range of 2-8.

5. The LED filament system of claim 1, wherein said sections comprise at least a first set of sections and a second set of sections, wherein sections of said first set and sections of said second set are arranged along the carrier in a repetitive manner.

6. The LED filament system of claim 1, wherein a radius of each of the loops of the spiral varies or is constant along the height of the spiral.

7. The LED filament system of claim 6, wherein the radius of each of the loops of the spiral varies along the height of the spiral, wherein a length of a section in a loop having a smaller radius is shorter than a length of a section in a loop having a larger radius.

8. The LED filament system of claim 1, wherein each section comprises at least two LEDs.

9. The LED filament of claim 1, wherein the LEDs of a section are electrically connected in series.

10. The LED filament system of claim 1, wherein said controller is configured to control a power supply to a first section, or to a first group of sections, differently than a power supply to a second section, or to a second group of sections.

11. The LED filament system of claim 1, wherein said controller is configured to control the powering of the sections, or the groups of sections, of the LED filament such that a luminous flux of the LED filament is substantially constant over time.

12. The LED filament system of claim 1, wherein said controller is configured to control the powering of the sections, or the groups of sections, of the LED filament based on a desired direction of light-emission, such that sections which emit light in a desired direction are turned on, and other sections are turned off.

13. A lighting device comprising:
a LED filament system as defined by claim 1;
an at least partially light-transmissive envelope, at least partially enveloping at least the LED filament of the LED filament system;
a base on which said envelope is mounted, said base being adapted for connection with a luminaire socket.

14. The LED filament system of claim 1, wherein the one side of the carrier on which the LEDs are arranged is a continuous widthwise surface, lacking any openings.

15. A light-emitting diode (LED) filament system comprising:
a LED filament comprising:
a carrier arranged in the shape of a spiral formed by successive loops;
a plurality of LEDs arranged in a linear array on one side of said carrier;
wherein said LEDs are arranged along the carrier in sections, each section has a position along the spiral-shaped carrier, wherein the LEDs are arranged in a single linear array on the one side of the carrier, and each section includes a respective entire predetermined length of the carrier that includes two or more LEDs; and
a controller configured to control a power supply to a section, or to a group of sections, of the LED filament;
wherein said controller is adapted to control one or more sections using a section's height and an angle of its position along the spiral-shaped carrier;
wherein said height is a distance from an end portion of the LED filament to the section along a central axis (A) of the spiral shape, and said angle is the position of the section along a loop relative to a starting point of the loop, and
wherein each loop of the LED filament comprises N sections, and wherein N borders between said N sections of a loop are vertically aligned with N borders between N sections of a successive loop, along the height of the spiral-shaped carrier.

\* \* \* \* \*